United States Patent
Tsuyuki et al.

(10) Patent No.: US 6,642,734 B1
(45) Date of Patent: Nov. 4, 2003

(54) METHOD AND APPARATUS TO GENERATE A GROUND LEVEL OF A SEMICONDUCTOR IC TESTER HAVING A PLURALITY OF SUBSTRATES

(75) Inventors: Shinichi Tsuyuki, Kamisato-machi (JP); Toshiaki Ogura, Honjyo (JP)

(73) Assignee: Hitachi Electronics Engineering Co., Ltd., Tokyo (JP)

( * ) Notice: Subject to any disclaimer, the term of this patent is extended or adjusted under 35 U.S.C. 154(b) by 46 days.

(21) Appl. No.: 09/707,020

(22) Filed: Nov. 6, 2000

(30) Foreign Application Priority Data

Dec. 1, 1999 (JP) .......................................... 11-342265

(51) Int. Cl.$^7$ ............................................. G01R 31/28
(52) U.S. Cl. .................................... 324/765; 324/158.1
(58) Field of Search .................................. 324/765, 763, 324/158.1, 73.1; 714/700, 733, 734

(56) References Cited

U.S. PATENT DOCUMENTS

| | | | | |
|---|---|---|---|---|
| 4,523,312 A | * | 6/1985 | Takeuchi | 714/736 |
| 4,928,278 A | * | 5/1990 | Otsuji et al. | 714/700 |
| 4,929,888 A | * | 5/1990 | Yoshida | 714/736 |
| 5,712,855 A | * | 1/1998 | Goto et al. | 714/700 |
| 6,275,023 B1 | * | 8/2001 | Oosaki et al. | 324/765 |

* cited by examiner

*Primary Examiner*—Vinh P. Nguyen
(74) *Attorney, Agent, or Firm*—Mayer Fortkort & Williams, PC; Karin L. William, Esq.

(57) ABSTRACT

When performing supply and measurement of various signals on n=8 semiconductor IC devices under test DUT1–DUT8 using m=3 substrates 10–30, reference voltages of the devices under test DUT1–DUT3 are input to the substrate 10, reference voltages of the devices under test DUT4–DUT6 are input to the substrate 20, and reference voltages of the devices under test DUT7 and 8 are input to the substrate 30. The reference voltages input to each substrate 10–30 are averaged. The mean voltages made in each substrate are further connected to each other, and a reference voltage is made using three substrates 10–30. The reference voltage is used as a reference voltage for voltage generating circuits 11–31. The reference voltage having no variation among each substrate is set even if the number of semiconductor IC devices under test is increased and the whole equipment becomes large.

12 Claims, 2 Drawing Sheets

METHOD AND APPARATUS TO GENERATE A GROUND LEVEL OF A SEMICONDUCTOR IC TESTER HAVING A PLURALITY OF SUBSTRATES

FIELD OF THE INVENTION

The present invention relates to a reference voltage setting method and apparatus for a semiconductor IC tester, which sets a reference voltage used as the standard voltage level for supplied signals and measurement signals when inspecting the electrical properties of semiconductor IC devices.

BACKGROUND OF THE INVENTION

Before shipping semiconductor IC devices as the final product, in which the performance and the quality are guaranteed, it is necessary to sample all or a part of the semiconductor IC devices at each process of manufacturing and inspection, and to inspect the electrical properties of them. A semiconductor IC tester inspects such electrical properties. The semiconductor IC tester supplies the predetermined test pattern data to a semiconductor IC device under test, reads the output data from the device under test, analyzes defect information based on the output data from the device under test to check whether there are any problems in the fundamental operation or the function of the device under test, and inspects the electrical properties.

Tests executed by the semiconductor IC tester are divided roughly into a direct current test and a function test. The direct current test is to inspect whether there are any defects in the fundamental operation of the semiconductor IC device under test by supplying a predetermined voltage or a predetermined current to input/output terminals of the device under test from a DC measurement circuit. On the other hand, the function test is to inspect whether there are any problems in the fundamental operation or the function of the semiconductor IC device under test by supplying the predetermined test pattern data to input terminals of the device under test from a pattern generator and by reading the output data from the device under test. That is, the function test changes input conditions, such as input timing, amplitude, etc., of incoming signals, such as an address, data, a write enable signal, and a tip selection signal, to the semiconductor IC devices under test, and examines the output timing, the output amplitude, etc. from the device under test.

Since pin electronics substrates, which are equipped with drivers for supplying signals, comparators for measuring signals, etc., and a back board of a test head, on which the substrates are mounted, are small, a conventional reference voltage setting apparatus for a semiconductor IC tester prepares only one ground level, which is used as the standard for supplied signals and measurement signals, in the test head, and sets a reference voltage based on it.

When the back board of the test head is comparatively small, the conventional reference voltage setting apparatus for a semiconductor IC tester has the simple structure, and has an advantage that assembly and adjustment is easy. However, when the number of the semiconductor IC devices under test, which can be inspected simultaneously, is increased and the whole equipment becomes large, the structure of the substrates itself also becomes large. In that case, variations of the substrates or variations of the test head turn into variations of the whole equipment, and variations come to arise in reference voltages among each substrate when making the reference voltage based on one place. When the reference voltages vary among each substrate, there is a disadvantage that variations arise also in levels of signals, which are supplied to the semiconductor IC devices under test.

SUMMARY OF THE INVENTION

The present invention is made in view of the problem mentioned above. The purpose of the present invention is to offer a reference voltage setting method and apparatus for a semiconductor IC tester, which is able to set a reference voltage having no variation among each substrate, even if the number of the semiconductor IC devices under test is increased and the whole equipment becomes large.

A feature of the present invention is inputting reference voltages of a certain number of semiconductor IC devices under test respectively to each substrate having drivers for supplying signals to semiconductor IC devices under test and comparators for measuring signals from said semiconductor IC devices under test, outputting a mean voltage of input reference voltages from each substrate, and setting a compound voltage of voltages, which are output from a plurality of substrates, as a reference voltage for the semiconductor IC tester.

In this invention, for example, when three (the 1st to 3rd) substrates supply and measure various signals for eight (the 1st to 8th) semiconductor IC devices under test, reference voltages of three (the 1st to 3rd) devices under test are input to the 1st substrate, reference voltages of three (the 4th to 6th) devices under test are input to the 2nd substrate, and reference voltages of two (the 7th and 8th) devices under test are input to the 3rd substrate. The reference voltages of the 1st to 3rd semiconductor IC devices under test input to the 1st substrate are added and averaged by the 1st level generating circuit prepared on the 1st substrate. The reference voltages of the 4th to 6th semiconductor IC devices under test input to the 2nd substrate are added and averaged by the 2nd level generating circuit prepared on the 2nd substrate. The reference voltages of the 7th and 8th semiconductor IC devices under test input to the 3rd substrate are added and averaged by the 3rd level generating circuit prepared on the 3rd substrate. Mean voltages made in the 1st to 3rd substrates are connected to each other among the 1st to 3rd substrates, and a compound voltage comes out at a connecting point. This compound voltage is set as a reference voltage for the semiconductor IC tester. By this, variations of the reference voltages among the substrates, which are used in the test head, and variations of the reference voltages within each substrate are minimized even if the number of the semiconductor IC devices under test is increased and the whole equipment becomes large. Moreover, in order to raise the test level accuracy of the semiconductor IC devices under test, it becomes possible to always make the reference voltages of the semiconductor IC devices under test into the standard for the semiconductor IC tester.

Another feature of the present invention is setting the compound voltage as a reference voltage for a voltage/current measurement circuit of the semiconductor IC device under test. By this, the voltage/current measurement is performed correctly since the same voltage or the same current is supplied to all semiconductor devices under test.

Another feature of the present invention is connecting lines, which input the reference voltages of a certain number of semiconductor IC devices under test to each substrate, to the ground through resistors respectively, and setting a compound voltage of voltages, which are detected through said resistors, when there is no semiconductor IC device under test, as a reference voltage for a self-diagnostic mode of the semiconductor IC tester. By this, a self-diagnosis is performed correctly even if the semiconductor IC device under test does not exist during the self-diagnostic mode since voltages of the nearest portions to the output parts of the substrates are made into the reference voltage.

Another feature of the present invention, when there are n semiconductor IC devices under test and m substrates, is that the number of semiconductor IC devices under test, of which the reference voltages are input to each substrate, corresponds to a whole number obtained by rounding up a fraction of n divided by m, and a mean voltage of input reference voltages is output from each substrate respectively. For example, when m=3 substrates supply and measure various signals for n=8 semiconductor IC devices under test, a whole number obtained by rounding up a fraction of n divided by m (8/3=2.66 . . . is three. Therefore, reference voltages of three (the 1st to 3rd) devices under test are input to the 1st substrate, reference voltages of three (the 4th to 6th) devices under test are input to the 2nd substrate, and reference voltages of the rest (the 7th and 8th) devices under test are input to the 3rd substrate. By equalizing the number of the reference voltages input to each substrate, variations of the reference voltages among the substrates, which are used in the test head, and variations of the reference voltages within each substrate are minimized.

DETAILED DESCRIPTION OF PREFRERRED EMBODIMENTS

Figure 2:
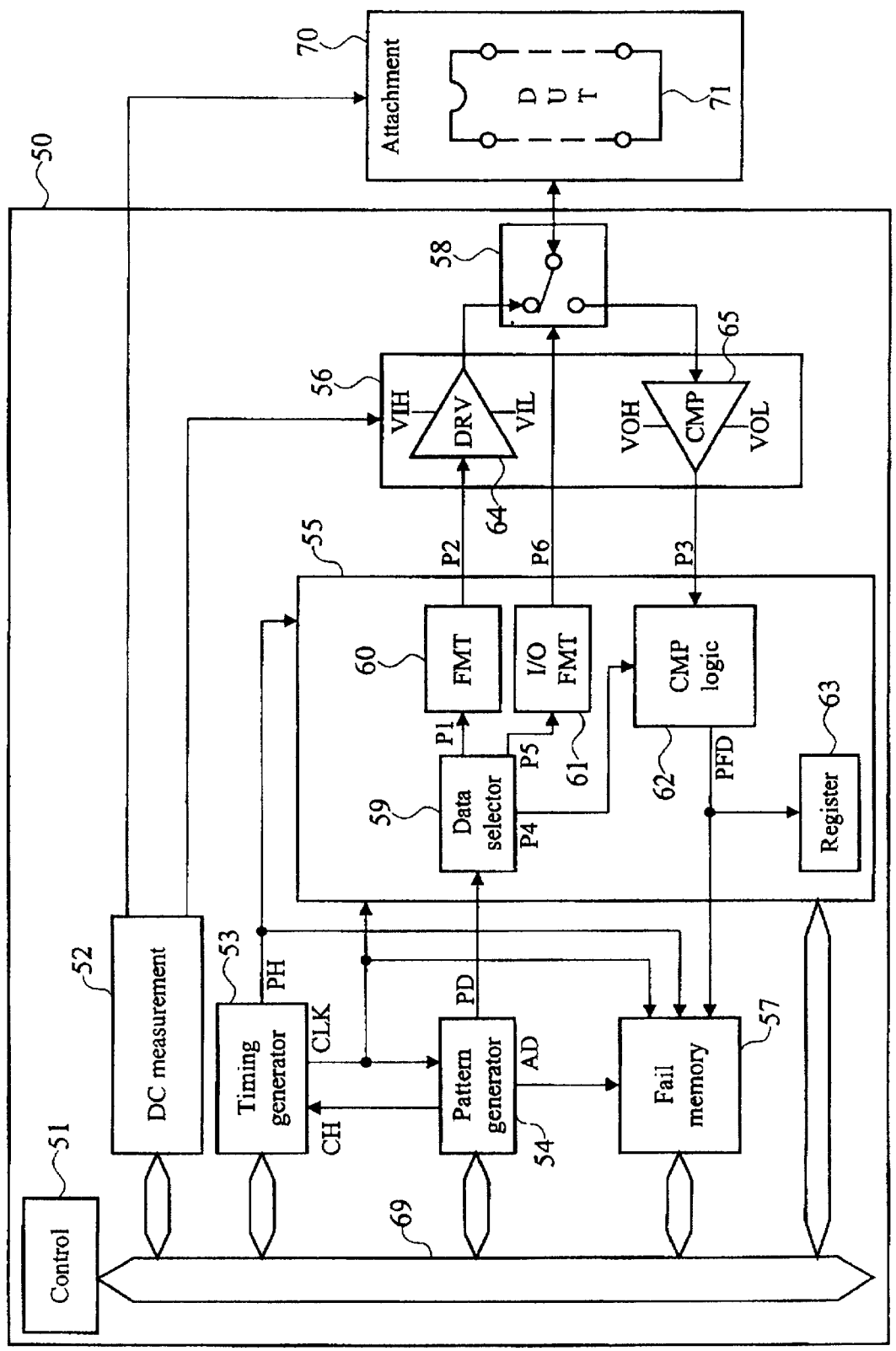
FIG. 2 is a block diagram showing an outline of the whole constitution of a semiconductor IC tester.

Further details are explained below with the help of an example illustrated in the attached drawings. FIG. 2 is a block diagram showing an outline of the whole constitution of a semiconductor IC tester. A semiconductor IC tester mainly consists of a tester portion 50 and a semiconductor IC device attachment 70. The tester portion 50 includes a control circuit 51, a DC measurement circuit 52, a timing generator 53, a pattern generator 54, a pin controller 55, a pin electronics substrate 56, a fail memory 57, and an input/output switch 58. Although the tester portion 50 has many other parts, only the parts required to understand the features of the present invention will be described in this specification.

Although the connecting relation between one pin electronics substrate 56 and one semiconductor IC device under test 71 mounted on the semiconductor IC device attachment 70 is shown schematically in FIG. 2, one set of m pin electronics substrates 56 and n semiconductor IC devices 71 are connected respectively in practice according to a predetermined rule. That is, the tester portion 50 and the semiconductor IC device attachment 70 are connected by signal lines, which consists of a plurality (Y pieces) of coaxial cables or the like corresponding to the total number (Y pieces) of input/output terminals of the semiconductor IC device attachment 70. The connecting relation between the terminals and the coaxial cables is matched up by a relay matrix, which is not illustrated, so that the transmission of various signals can be performed between the predetermined terminals and the coaxial cables. Physically, the number of the signal lines is equal to the total number of the input/output terminals of the semiconductor IC device attachment 70. The semiconductor IC device attachment 70 is constituted so that a plurality of semiconductor IC devices under test 71 can be mounted on its sockets. Input/output terminals of the semiconductor IC devices under test 71 and the input/output terminal of the semiconductor IC device attachment 70 are matched up and connected one by one respectively. For example, the semiconductor IC device attachment 70, which can carry eight semiconductor IC devices under test 71 having thirty input/output terminals, has two hundred forty input/output terminals as a whole.

The control circuit 51 is constructed with microprocessors, and it performs the whole control, operation, management, etc. of the semiconductor IC tester. Therefore, although not illustrated, the control circuit 51 includes ROMs for storing a system program, RAMs for storing various data, and the like. The control circuit 51 is connected to the DC measurement circuit 52, the timing generator 53, the pattern generator 54, the pin controller 55, and the fail memory 57 through a tester bus (a data bus, an address bus, and a control bus) 69. The control circuit 51 outputs the data for a direct current test to the DC measurement circuit 52, outputs the timing data for a function test start to the timing generator 53, outputs a program required for test pattern generation and various data, etc. to the pattern generator 54, and outputs the expected data etc. to the pin controller 55, respectively. In addition, the control circuit 51 outputs various kinds of data to each part in the semiconductor IC tester through the tester bus 69. Moreover, the control circuit 51 reads out the direct current data and the pass/fail data PFD, in which a test result is indicated, from an internal register of the DC measurement circuit 52, the fail memory 57, and a pass/fail register 63 in the pin controller 55, then analyzes them and judges whether the semiconductor IC device under test 71 is defective or not.

The DC measurement circuit 52 receives the direct current test data from the control circuit 51, and performs a direct current test on the semiconductor IC device under test 71 mounted on the semiconductor IC device attachment 70 based on it. The DC measurement circuit 52 starts the direct current test by inputting a measurement start signal from the control circuit 51, and writes the test result data in the internal register. The DC measurement circuit 52 outputs an end signal to the control circuit 51 after finishing the writing of the test result data. The data written in the internal register is read out by the control circuit 51 through the tester bus 69, and is analyzed there. The direct current test is performed in this way. Moreover, the DC measurement circuit 52 supplies reference voltages VIH, VIL, VOH, and VOL to a driver 64 and an analog comparator 65 on the pin electronics substrate 56.

The timing generator 53 memorizes the timing data, which is output from the control circuit 51, in an internal memory, outputs a high-speed operation clock CLK to the pattern generator 54, the pin controller 55, and the fail memory 57 based on it, and outputs a timing signal PH for data reading/writing to the pin controller 55 and the fail memory 57 based on it. Therefore, the high-speed operation clock CLK determines the operation speed of the pattern generator 54 and the pin controller 55, and the timing signal PH determines the data reading/writing timing for the semiconductor IC device under test 71. Moreover, the timing signal PH also determines the write timing of the pass/fail data PFD for the fail memory 57. Therefore, the output timing of a test signal P2, which is output from a formatter 60 to the pin electronics substrate 56, and the output timing of a switching signal P6, which is output from an I/O formatter 61 to the input/output switch 58, are also controlled according to the high-speed operation clock CLK and the timing signal PH, which are output from the timing generator 53. Moreover, the timing generator 53 inputs a timing change control signal CH from the pattern generator 54, and changes an operation cycle, a phase, etc. suitably based on it.

The pattern generator 54 inputs a pattern program (a micro program and the pattern data) for pattern creation from the control circuit 51, and outputs the pattern data PD to a data selector 59 in the pin controller 55 based on it. That is, the pattern generator 54 operates as a program system, which outputs the regular test pattern data by various signal processing according to a micro program, or operates as a memory stored system, which outputs the random pattern data (the expected data) by writing the same data for the semiconductor IC device under test 71 in an internal memory (a random pattern memory) and by reading them using the same address for the device under test. In case of memory mixed semiconductor IC devices, tests for memory portions are performed by the program system, and tests for logic portions are performed by the memory stored system.

The pin controller 55 includes the data selector 59, the formatter 60, the I/O formatter 61, a comparator logic circuit 62, and the pass/fail register 63. The data selector 59 includes memories, which store various kinds of test signal creation data (the address data and the write data) P1, the switching signal creation data P5, and the expected data P4. The data selector 59 inputs the pattern data from the pattern generator 54 as an address, outputs the test signal creation data P1 according to the address to the formatter 60, outputs the switching signal creation data P5 to the I/O formatter 61, and outputs the expected data P4 to the comparator logic circuit 62, respectively. The formatter 60 is constituted of multi-stages of flip-flop circuits and logic circuits. The formatter 60 makes a predetermined supplying signal waveform of the test signal creation data (the address data and the write data) P1, which is output from the data selector 59, synchronizes it with the timing signal PH, which is output from the timing generator 53, and outputs it to the driver 64 on the pin electronics substrate 56 as the test signal P2. The I/O formatter 61 is also constituted of multi-stages of flip-flop circuits and logic circuits. The I/O formatter 61 makes a predetermined supplying signal waveform of the switching signal creation data P5, which is output from the data selector 59, synchronizes it with the timing signal PH, which is output from the timing generator 53, and outputs it to the input/output switch 58 as the switching signal P6.

The comparator logic circuit 62 carries out a comparison judgment of the digital read data P3, which is output from the analog comparator 65 on the pin electronics substrate 56, with the expected data P4, which is output from the data selector 59. The comparator logic circuit 62 outputs the pass/fail data PFD, in which a judgment result is indicated, to the pass/fail register 63 and the fail memory 57. The pass/fail register 63 is a register for memorizing whether the semiconductor IC device under test 71 is judged to be fail by the comparator logic circuit 62 during the function test. The pass/fail register 63 consists of the number of bits corresponding to the number of the semiconductor IC devices under test 71, which can be mounted on the semiconductor IC device attachment 70. That is, when the semiconductor IC device attachment 70 can carry the maximum of thirty-two semiconductor IC devices under test 71, the pass/fail register 63 consists of thirty-two bits. When a bit of the pass/fail register 63 relating to the semiconductor IC device under test 71 is high level "1", which indicates "PASS", the device under test is judged to be non-defective. If the bit is low level "0", which indicates "FAIL", there are some defects in the device under test, and the device under test is judged to be defective. Therefore, when analyzing a defective portion in detail, it is necessary to use the fail memory 57.

The pin electronics substrate 56 carries a plurality of drivers 64 and a plurality of analog comparators 65. Each driver 64 and each analog comparator 65 are prepared for each input/output terminal of the semiconductor IC device attachment 70, and one of them can be connected to the input/output terminal of the semiconductor IC device attachment 70 through the input/output switch 58. The input/output switch 58 changes the connection between the input/output terminal of the semiconductor IC device attachment 70 and either of the driver 64 and the analog comparator 65 according to the switching signal P6, which is output from the I/O formatter 61. Therefore, when the number of the input/output terminals of the semiconductor IC device attachment 70 is X, there are X drivers 64, X analog comparators 65, and X input/output switches 58 respectively. However, when measuring semiconductor memories and the like, there may be less analog comparators and input/output switches since the analog comparator is unnecessary for address terminals, tip selection terminals, etc.

The driver 64 supplies a signal of high level "H" or low level "L" according to the test signal P2, which is output from the formatter 60 in the pin controller 55, to the input/output terminal of the semiconductor IC device attachment 70, i.e., the address terminal, the data input terminal, the tip selection terminal, and a write enable terminal, etc. of the semiconductor IC device under test 71, through the input/output switch 58, and writes a desired test pattern in the semiconductor IC device under test 71. The analog comparator 65 inputs an output signal from the data output terminal of the semiconductor IC device under test 71 through the input/output switch 58, compares it with the reference voltages VOH and VOL at the timing of the strobe signal (not illustrated), which is output from the timing generator 53, and outputs a comparison result to the comparator logic circuit 62 as the digital read data P3 of high level "PASS" or low level "FAIL". Usually the analog comparator 65 consists of two comparators, one for the reference voltage VOH, and the other for the reference voltage VOL, but illustration is omitted in FIG. 2.

The fail memory 57 memorizes the pass/fail data PFD, which is output from the comparator logic circuit 62, in an address position corresponding to an address signal AD, which is output from the pattern generator 54, at the input timing of the timing signal PH, which is output from the timing generator 53. The fail memory 57 consists of SRAMs made of CMOS, which has the almost same storage capacity as the semiconductor IC device under test 71 and which is able to be read/written at any time. The fail memory 57 is used for analyzing a defective portion when the semiconductor IC device under test 71 is judged to be defective. Therefore, the fail memory 57 is not used during an ordinary quality judgment. The fail memory 57 has data input/output terminals, which correspond to the data output terminals of the semiconductor IC device attachment 70. For example, when the semiconductor IC device attachment 70 has the total of two hundred forty input/output terminals and one hundred sixty among them are the data output terminals, the number of data input terminals of the fail memory 57 is equal to the number of the data output terminals or more. The pass/fail data PFD stored in the fail memory 57 is read out by the control circuit 51, transmitted to a memory for data processing, which is not illustrated, and analyzed.

Figure 1:
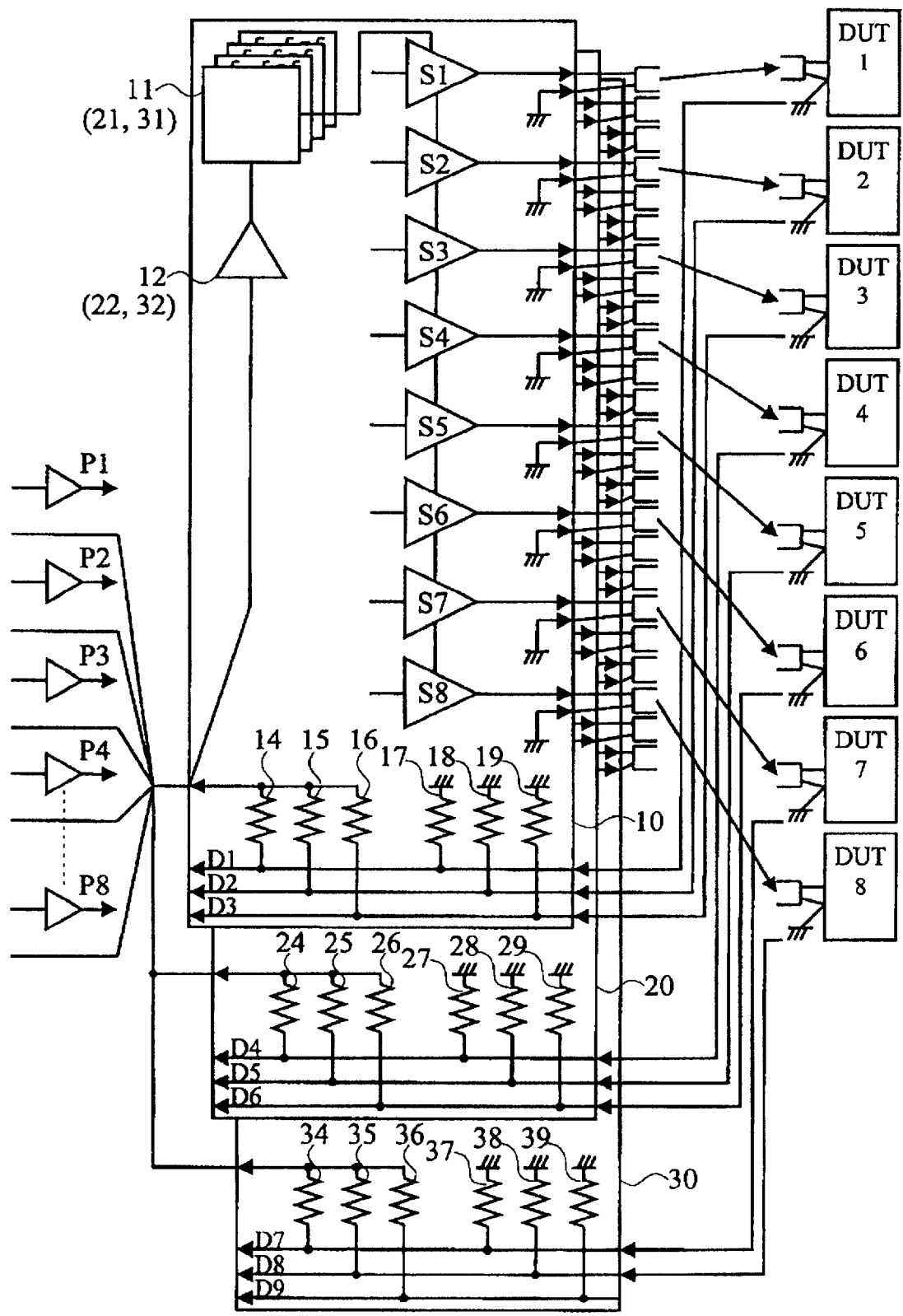
FIG. 1 shows an example of the reference voltage setting apparatus for a semiconductor IC tester according to the present invention.

FIG. 1 shows an example of the reference voltage setting apparatus for a semiconductor IC tester according to the present invention. In FIG. 1, n=8 semiconductor IC devices under test DUT1–DUT8 are connected with m=3 pin electronics substrates 10–30 through signal lines. That is, the embodiment is constituted so that signal supply and signal measurement can be performed for eight semiconductor IC devices under test DUT1–DUT8 using three pin electronics substrates 10–30. In FIG. 1, drivers S1–S8 are illustrated, but illustration of analog comparators is omitted.

An output signal from the driver S1 on the pin electronics substrate 10 is supplied to the semiconductor device under test DUT1 through a signal line. In the same manner, output signals from drivers S2–S8 are supplied to the semiconductor IC devices DUT2–DTU8 through each signal line respectively. Although not illustrated, there are drivers T1–T8 on the pin electronics substrate 20. Output signals from the drivers T1–T8 are also supplied to the semiconductor IC devices under test DUT1–DTU8 through each signal line respectively. Although not illustrated, there are drivers U1–U8 on the pin electronics substrate 30, and output signals from the drivers U1–U8 are also supplied to the semiconductor IC devices under test DUT1–DTU8 through each signal line respectively. The signal lines, which connect the semiconductor IC devices under test DUT1–DUT8 and the pin electronics substrates 10–30, are grounded at their both-ends through ground lines.

On the other hand, a reference voltage (ground) of the semiconductor IC device under test DUT1 is connected to a ground line D1 on the pin electronics substrate 10, a reference voltage of the semiconductor IC device under test DUT2 is connected to a ground line D2, and a reference voltage of the semiconductor IC device under test DUT3 is connected to a ground line D3, through each signal line, respectively. In the same manner, a reference voltage of the semiconductor IC device under test DUT4 is connected to a ground line D4 on the pin electronics substrate 20, a reference voltage of the semiconductor IC device under test DUT5 is connected to a ground line D5, and a reference voltage of the semiconductor IC device under test DUT6 is connected to a ground line D6, through each signal line, respectively. Moreover, a reference voltage of the semiconductor IC device under test DUT7 is connected to a ground line D7 on the pin electronics substrate 30, and a reference voltage of the semiconductor IC device under test DUT8 is connected to a ground line D8, through each signal line, respectively. Nothing is connected to a ground line D9 on the pin electronics substrate 30.

The ground lines D1–D3 on the pin electronics substrate 10 are connected to each other through resistors 14–16, and a mean voltage of the ground lines D1–D3 is obtained as a reference voltage for the pin electronics substrate 10. In the same manner, the ground lines D4–D6 on the pin electronics substrate 20 are connected to each other through resistors 24–26, and a mean voltage of the ground lines D4–D6 is obtained as a reference voltage for the pin electronics substrate 20. The ground lines D7 and D8 on the pin electronics substrate 30 are connected to each other through resistors 34 and 35, and a mean voltage of the ground lines D7 and D8 is obtained as a reference voltage for the pin electronics substrate 30. Furthermore, the reference voltages of the pin electronics substrates 10–30 are connected to each other through signal lines, and the reference voltages are further equalized among the pin electronics substrates 10–30. Then, the equalized reference voltage is supplied to voltage generating circuits 11–31 on each pin electronics substrate 10–30 through amplifiers 12–32. By this, variations of the reference voltages among the substrates, which are used in the test head, and variations of the reference voltages within each substrate are minimized. Moreover, in order to raise the test level accuracy of the semiconductor IC devices under test, it becomes possible to always make the reference voltages of the semiconductor IC devices under test into the standard for the semiconductor IC tester.

The ground lines D1–D3 on the pin electronics substrate 10 are connected to ground lines of the signal lines, which connect the semiconductor IC devices under test DUT1–DUT8 and the pin electronics substrate 10, through resistors 17–19 respectively. In the same manner, the ground lines D4–D6 on the pin electronics substrate, 20 are connected to ground lines of the signal lines, which connect the semiconductor IC devices under test DUT1–DUT8 and the pin electronics substrate 20, through resistors 27–29 respectively. The ground lines D7 and D8 on the pin electronics substrate 30 are connected to ground lines of the signal lines, which connect the semiconductor IC devices under test DUT1–DUT8 and the pin electronics substrate 30, through resistors 37 and 38 respectively. By connecting the ground lines D1–D8 on the pin electronics substrate 10–30 to the ground lines of the signal lines through the resistors 17–19, 27–29, 37 and 38, a self-diagnosis is performed correctly even if the semiconductor IC devices under test DUT1–DUT8 do not exist during a self-diagnostic mode since voltages of the nearest portions to the output parts of the pin electronics substrates 10–30 can be made into the reference voltage.

Furthermore, when performing a voltage/current measurement on the semiconductor IC devices under test DUT1–DUT8 by supplying a predetermined voltage or a predetermined current to the semiconductor IC devices under test DUT1–DUT8 from the DC measurement circuit 52, the amplifiers P1–P8 supplies a voltage/current based on the reference voltage, which is equalized among the pin electronics substrates 10–30. By this, the voltage/current measurement is performed correctly since the same voltage or the same current can be supplied to all semiconductor devices under test DUT1–DUT8.

Although the reference voltage is set for eight semiconductor IC devices under test DUT1–DUT8 using three pin electronics substrates 10–30 in the above-mentioned embodiment, the present invention is not restricted to this. When setting the reference voltage for n semiconductor IC devices under test using m pin electronics substrates, what is necessary is to prepare L or more ground lines, wherein the number L corresponds to a whole number obtained by rounding up a fraction of n divided by m, on the pin electronics substrates, and to connect reference voltages of L semiconductor IC devices under test to the ground lines on the pin electronics substrates.

Moreover, although the above-mentioned embodiment explains an example, where the reference voltages of two semiconductor IC devices under test DUT7 and DUT8 are connected to the pin electronics substrate 30, two semiconductor IC devices under test may be connected to either the pin electronics substrate 10 or 20. Furthermore, although the same number of ground lines are prepared on each pin electronics substrate in the above-mentioned embodiment, the same number of ground lines are not necessary for each pin electronics substrates. For example, three ground lines may be prepared on the pin electronics substrates 10 and 20, and two ground lines may be prepared on the pin electronics substrate 30.

Although the above-mentioned embodiment explains an example, where the ground lines are prepared at one side of each pin electronics substrate, the ground lines may be prepared at a different position for each pin electronics substrate, or at the same position for each pin electronics substrate. Moreover, there may be more ground lines than m, which is the number of the semiconductor IC devices under test connected to the ground lines. For example, four ground lines may be prepared and only three of them may be used. Although the reference voltages of three pin electronics substrates are connected in the above-mentioned embodiment, it is allowable to connect the reference voltages of all pin electronics substrates, which constitutes a semiconductor IC tester.

According to the present invention, the reference voltage having no variation among each substrate is able to be set even if the number of the semiconductor IC devices under test is increased and the whole equipment becomes large.

What is claimed is:

1. An apparatus for generating a ground level of a semiconductor IC tester having a plurality of substrates comprising:

a plurality of first level generating means, wherein each first level generating means is prepared respectively on each of the plurality of substrates, wherein each of the plurality of substrates supplies signals to semiconductor IC devices under test and receives signals from the semiconductor IC devices under test, each of said plurality of first level generating means receiving at an input ground levels of a corresponding number of semiconductor IC devices under test and outputting a mean voltage of the received input ground levels; and a second generating means for receiving at an input the mean voltages output from said plurality of first level generating means, and outputting a compound voltage of the input mean voltages.

2. An apparatus according to claim 1, wherein said second generating means sets said compound voltage as a ground level for a voltage/current measurement circuit of the semiconductor IC device under test.

3. An apparatus according to claim 1, further comprising resistor means for connecting lines, which supply the ground levels of a corresponding number of semiconductor IC devices under test to said plurality of first level generating means, to the ground in each of the plurality of substrates, respectively, wherein said second generating means sets a compound voltage, of voltages which are detected through said resistor means, when there is no semiconductor IC device under test, as a ground level for a self-diagnostic mode of the semiconductor IC tester.

4. An apparatus according to claim 1, wherein there are n semiconductor IC devices under test and m substrates, said plurality of first level generating means inputs ground levels of the number of semiconductor IC devices under test, which corresponds to a whole number obtained by rounding up a fraction of n divided by m, and outputs a mean voltage of input ground levels.

5. An apparatus for generating a ground level of a semiconductor IC tester having a plurality of substrate, the apparatus comprising:

a plurality of sets of wiring means, each set of wiring means respectively on a corresponding substrate of the plurality of substrates, wherein each of the plurality of substrates supplies signals to semiconductor IC devices under test and receives signals from the semiconductor IC devices under test, each of said plurality of sets of wiring means inputting ground levels of a corresponding number of semiconductor IC devices under test;

a plurality of first level generating means, each first level generating means respectively on a corresponding substrate of the plurality of substrates, each of the plurality of first level generating means connecting the ground levels, input by a set of said plurality of sets of wiring means, to a connecting point through resistors, and outputting a mean voltage of input reference voltages at said connecting point; and a second generating means for receiving the mean voltages which are output from said first generating means and for outputting a compound voltage of input mean voltages.

6. An apparatus according to claim 5, wherein said second generating means sets said compound voltage as a ground level for a voltage/current measurement circuit of the semiconductor IC device under test.

7. An apparatus according to claim 5, further comprising resistor means for connecting said wiring means to the ground, in each corresponding substrate, respectively, wherein said second generating means sets a compound voltage, of voltages which are detected through said resistor means, when there is no semiconductor IC device under test, as a ground level for a self-diagnostic mode of the semiconductor IC tester.

8. An apparatus according to claim 5, wherein there are n semiconductor IC devices under test and m substrates, said plurality of first level generating means inputs ground levels of the number of semiconductor IC devices under test, which corresponds to a whole number obtained by rounding up a fraction of n divided by m, and outputs a mean voltage of input ground levels.

9. A reference voltage setting method for generating a ground level of a semiconductor IC tester having a plurality of substrates, the method comprising the steps of:

receiving ground levels of a plurality of semiconductor IC devices under test at a respective substrate, wherein each substrate supplies signals to corresponding semiconductor IC devices under test and receives signals from the corresponding semiconductor IC devices under test;

outputting a mean voltage of received ground levels from each of the plurality of substrates; and setting a compound voltage, of voltages which are output from the plurality of substrates, as a ground level for the semiconductor IC tester.

10. A method according to claim 9, further comprising a step of setting the compound voltage as a ground level for a voltage/current measurement circuit of the semiconductor IC device under test.

11. A method according to claim 9, further comprising the steps of:

connecting lines, which input the ground levels of a corresponding number of semiconductor IC devices under test to each corresponding substrate, to ground through resistors respectively, and setting a compound voltage, of voltages which are detected through the resistors, when there is no semiconductor IC device under test, as a ground level for a self-diagnostic mode of the semiconductor IC tester.

12. A method according to claim 9, wherein there are n semiconductor IC devices under test and m substrates, the number of semiconductor IC devices under test, of which the ground levels are input to each corresponding substrate, corresponds to a whole number obtained by rounding up a fraction of n divided by m, and a mean voltage of input ground levels is output from each substrate respectively.

* * * * *